United States Patent
Beausoleil et al.

(10) Patent No.: US 8,081,850 B2
(45) Date of Patent: Dec. 20, 2011

(54) DEVICE WITH TUNABLE PLASMON RESONANCE

(75) Inventors: Raymond G. Beausoleil, Redmond, WA (US); Sagi V. Mathal, Palo Alto, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 371 days.

(21) Appl. No.: 12/433,850

(22) Filed: Apr. 30, 2009

(65) Prior Publication Data

US 2010/0278474 A1    Nov. 4, 2010

(51) Int. Cl.
*G02F 1/035* (2006.01)
*G02B 6/00* (2006.01)
*H01L 21/332* (2006.01)
*G01J 3/30* (2006.01)

(52) U.S. Cl. .............. 385/2; 385/147; 438/133

(58) Field of Classification Search ............ 385/2–14, 385/115–131, 147; 372/64, 99; 356/318, 356/128, 432–442; 359/278; 438/133, 138
See application file for complete search history.

(56) References Cited

U.S. PATENT DOCUMENTS

| 6,829,269 B2 * | 12/2004 | Goodhue et al. | 372/43.01 |
| 7,079,240 B2 * | 7/2006 | Scherer et al. | 356/318 |
| 7,957,648 B2 * | 6/2011 | Hillis et al. | 398/115 |
| 2008/0090337 A1 * | 4/2008 | Williams | 438/133 |

OTHER PUBLICATIONS

Zheludev, N.I. et al., "Lasing Spaser" Nature Photonics, vol. 2, pp. 351-354 (Jun. 2008).

* cited by examiner

*Primary Examiner* — Akm Ullah

(57) ABSTRACT

A device includes a resonator capable of supporting a plasmon mode, a gain structure arranged to couple energy into the resonator, and a memristive layer arranged to provide an interaction with the plasmon mode. An electric signal applied to the memristive layer can change the interaction and change a resonant frequency of the plasmon mode.

15 Claims, 3 Drawing Sheets

DEVICE WITH TUNABLE PLASMON RESONANCE

BACKGROUND

Integrated circuit manufacturing techniques are now able to produces devices with feature sizes on the order of tens of nanometers. With these small feature sizes, material properties and quantum effects, which can be mostly ignored for larger devices, become more important and allow production of new types of devices. A SPASER, which gets its name from "surface plasmon amplification by stimulated emission of radiation" is a device that utilizes resonances of surface plasmons, which can arise on small metal regions. Surface plasmons themselves are giant oscillations of electron density at a surface of a material, typically a metal, which can be approximately modeled as a free electron sea in a compensating positive ionic background. When confined and not over damped, these surface plasmons are quantized and can have particle-like properties. Surface plasmons can also couple to or exchange energy with light modes and other electromagnetic radiation. In a SPASER, a pumping process increases the energy in a resonant mode of plasmons confined in a small region, so that the plasmons can create a large local electric field or emit electromagnetic radiation with a characteristic frequency that depends on the resonant mode of the plasmons.

Another device that has become practical through use of the properties of nanoscale materials is the memristor. U.S. Pat. App. Pub. No. 2008/0090337, entitled "Electrically Actuated Switch," to R. Stanley Williams describes a switch that changes between a high-conductivity state and a low-conductivity state as a result of movement of dopants in thin layers of material. These switches can effectively act as resistors with memory (or memristors) having resistance that depends on the total dopant currents (and resulting dopant configuration) in the switches. Operation of the switches generally rely on behavior of nanoscale materials, particularly, the interaction of a primary material such as titanium dioxide ($TiO_2$) and a source material such as oxygen depleted titanium dioxide $TiO_{2-x}$ that contains dopants (e.g., oxygen vacancies) that can move in response to an electric field. When the primary material and the source material are between two electrodes and a sufficient bias voltage is applied, charged dopant move between the primary material and the source material and can drastically change the electrical and optical characteristics of the primary material. For example, dopants flowing into an intrinsic primary material can make the primary material significantly more conductive, and dopant ions flowing out of the primary material can return the primary material to its intrinsic non-conductive state.

The pursuit of new devices employing the properties of nanoscale materials continues.

BRIEF DESCRIPTION OF THE DRAWINGS

Use of the same reference symbols in different figures indicates similar or identical items.

DETAILED DESCRIPTION

In accordance with an aspect of the invention, the frequency of a desired resonant mode of surface plasmons in a device can be tuned using a memristive layer that interacts with the plasmon mode. As a result, the frequency of electromagnetic radiation emitted by a device such as a SPASER can be tuned after the device is fabricated to achieve a desired frequency, and multiple SPASERs that may be manufactured in the same integrated structure can be tuned to all produce the same frequency or to produce a desired set of frequencies for emitted other electromagnetic radiation. Control of the frequency of the resonant mode can also allow tuning of the gain of a device since the efficiency with which energy from a gain medium couples into a plasmon mode typically depends on the frequency of the plasmon mode.

Figure 1:
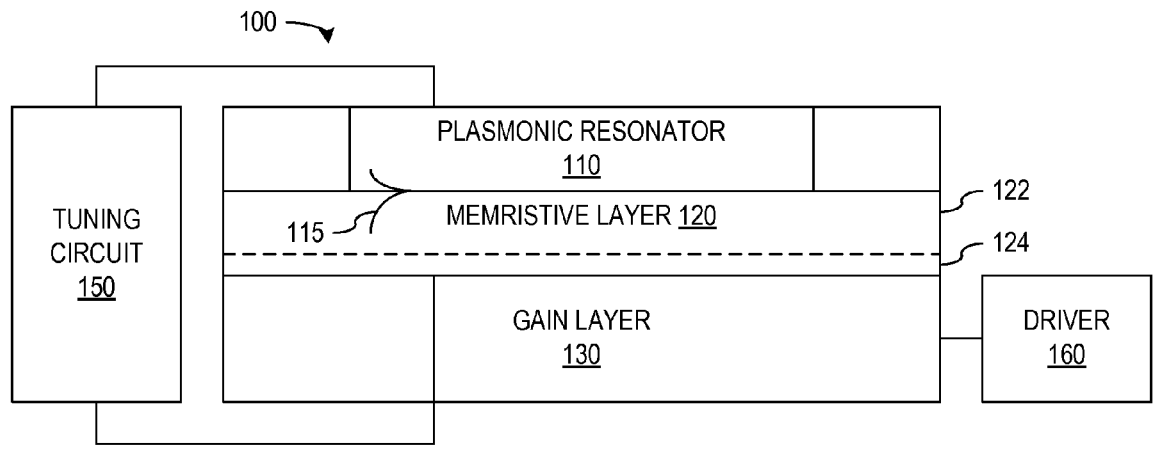
FIG. 1 shows a cross-sectional view of a SPASER in accordance with an embodiment of the invention including a memristive layer between a resonator and a gain layer.

FIG. 1 shows a cross-sectional view of a SPASER 100 in accordance with an embodiment of the invention. SPASER 100 includes a plasmonic resonator 110, a memristive layer 120, and a gain layer 130 fabricated on a suitable substrate (e.g., a glass, quartz, silicon, plastic, polymer, or III-V semiconductor substrate.) Plasmonic resonator 110 can be a metal region or particle having lateral dimensions from about 70 or 250 nm to several micrometers and a thickness on the order of tens to hundreds of nanometers. The size of resonator 110 will generally depend on the desired resonant frequency. Surface plasmons, which correspond to oscillations of electron density near the interface of resonator 110 and memristive layer 120, will have resonances that depend on the geometry, lateral dimensions, and thickness of resonator 110, the dielectric constant of the material of resonator 110, and the dielectric constant of the environment surrounding resonator 110. Surface plasmons are generally confined to a thin region at the interface of resonator 110 with adjacent material, and FIG. 1 shows a plasmon tail 115 illustrating how the magnitude of the surface plasmon mode profile may fall with distance into the adjacent memristive layer 120. Many types of materials (particularly metals) are known to support surface plasmons and may be used in resonator 110, and in an exemplary embodiment, plasmonic resonator 110 is a region of gold or silver, laterally surrounded by an insulating material.

Memristive layer 120 is a structure having a conductivity and electrical permittivity that is electrically programmable. Several compositions for memristive layers are known and described, for example, by U.S. Pat. App. Pub. No. 2008/0090337, entitled "Electrically Actuated Switch," to R. Stanley Williams, which is hereby incorporated by reference in its entirety. As shown in FIG. 1, memristive layer 120 can include sub-layers 122 and 124 respectively of a primary material and a source material. The primary material is generally a material that provides mobility to charged dopants from the source material, where the mobility is such that an applied electric field of sufficient magnitude can drive some of the dopants from the source material into the primary material (or drive the dopants out of the primary material into the source material.) The primary material is also such that the introduction of the dopants changes the electrical properties of the primary material.

An exemplary primary/source material combination is titanium dioxide ($TiO_2$) and oxygen depleted titanium dioxide ($TiO_{2-x}$). $TiO_2$ is an insulator in its intrinsic state but becomes a semiconductor when oxygen vacancies are introduced. An applied electric field (i.e., a voltage difference across memristive layer 120) that drives oxygen vacancies from the source material ($TiO_{2-x}$) into the primary material ($TiO_2$) can thus significantly increase the conductivity and change the electrical permittivity of the primary material. Similarly, an electric field that drives oxygen vacancies in from the primary material ($TiO_2$) back into the source material ($TiO_{2-x}$ can significantly decrease the conductivity and reverse the change in the electrical permittivity of the primary material. When memristive layer 120 is on the order of hundreds or tens of nanometers thick, the change in electrical properties of memristive layer 120 may be switched in a time as short as a few nanoseconds. Some other combinations of primary/source materials that may be suitable for memristive layer 120 include: $ZrO_2/ZrO_{2-x}$, $HfO_2/HfO_{2-x}$, and $SrTiO_3/SrTiO_{3-x}$ which use oxygen vacancies as mobile dopants; $GaN/GaN_{1-x}$, which uses nitrogen vacancies as mobile dopants; $CuCl/CuCl_{1-x}$, which uses chlorine vacancies as mobile dopants; and GaN/GaN:S, which uses sulfide ions as mobile dopants.

A tuning circuit 150, which may be integrated as part of SPASER 100 or a separate device employed during manufacture of SPASER 100, applies electrical signals to electrodes on the top and bottom surfaces of memristive layer 120 to change the electrical properties of memristive layer 120 as described above. The change then remains fixed until or unless another electrical signal is applied to move the mobile dopants in memristive layer 120. In one embodiment, plasmonic resonator 110 and a ground plane (not shown) or a doped region (not shown) in gain layer 130 act as the electrodes through which tuning circuit 150 applies electrical signals to tune the electrical properties of memristive layer 120. However, in other embodiments, separate electrodes (not shown) can be fabricated for the purpose of applying the electrical fields that change memristive layer 120.

Gain layer 130 includes an active material that couples energy into a desired high Q resonant mode (e.g., the fundamental resonant mode) of the surface plasmons in resonator 110. Gain layer 130 can generally be similar in structure to the active materials in a semiconductor laser. For example, gain layer 130 may be one or more layers of semiconductor material such as gallium arsenide (GaAs), indium gallium arsenide (InGaAs), gallium nitride (GaN), or any suitable compound semiconductors that is doped so that driving an electrical current through gain layer causes a population inversion between the conduction and valence bands in the material of gain layer 130. The active material of gain layer 130 is chosen such that the transitions between the conduction and valence bands have an electromagnetic coupling to the desired plasmon mode in resonator 110. As a result, electrical energy from the drive current is coupled into the desired plasmon mode. In other embodiments of the invention, gain layer 130 can contain quantum wells, quantum dots, or similar structures that are well known in the field of semiconductor lasers as mechanisms for coupling energy from a drive current into an electromagnetic mode, and the energy from the electromagnetic mode can be readily coupled into electron oscillations in the form of surface plasmons. Yet other structures such as quantum dots could be used as or in gain layer 130 for conversion of electrical energy into energy in the desired plasmon resonance. Alternatively, gain layer 130 can be driven by an optical energy source such as a laser, flash lamp, or LED to couple input optical energy into the plasmon resonance.

Driver 160 in FIG. 1 represents the circuitry or light source used to energize or pump gain layer 130. Driver 160 can either operate at a constant level or can vary the pumping of gain layer 130. For example, drive circuit 160 can modulate the current injection or optical pumping of gain layer 130 according to an input data signal, so that resonator 110 will emit electromagnetic radiation that is similarly modulated in amplitude.

The resonant plasmon mode which receives energy from gain medium 130 includes a tail 115, which extends into memristive layer 120 as described above. Accordingly, surface plasmons at the interface of resonator 110 interact with memristive layer 120 and have a resonant frequency that depends on the electrical permittivity of memristive layer 120. An electrical signal applied across memristive layer 120 as described above to increase (or decrease) the electrical permittivity of memristive layer 115 at the interface with plasmon resonator 110 can therefore decrease (or increase) the resonant frequency, so that in accordance with an aspect of the invention, the desired resonant frequency of SPASER 100 is electrically programmable.

SPASER 100 can be fabricated using known integrated circuit technology. In particular, gain layer 130 can be formed of layers of semiconductor material such as gallium arsenide (GaAs), indium gallium arsenide (InGaAs), indium phosphide (InP), indium gallium arsenide phosphide (InGaAsP), indium gallium aluminum arsenide (InGaAlAs), gallium nitride (GaN), or other suitable semiconductor material on a substrate (not shown). Since gain layer 130 performs a similar function to the active material in a semiconductor laser, structures and fabrication techniques that are known for semiconductor lasers could be employed in fabrication of gain layer 130. Memristive layer 120 can be formed using a layer of primary material such as $TiO_2$ that is deposited on gain layer 130, and the source layer can be created using an atomic layer of titanium or other material that interacts with $TiO_2$ to create oxygen vacancies. Some other well known methods to form the primary and source layers include sputtering, electron beam evaporation, and atomic layer deposition. Memristive layer 120 is preferably thin (e.g., about 10 to 100 nm thick) for fast switching, low voltage operation, and to minimize the separation between gain layer 130 and resonator 110. Plasmonic resonator 110 can be formed from a layer of metal (e.g., silver or gold) that is about 10 to 100 nm thick and patterned to define the dimensions and shape of resonator 110.

Figure 2:
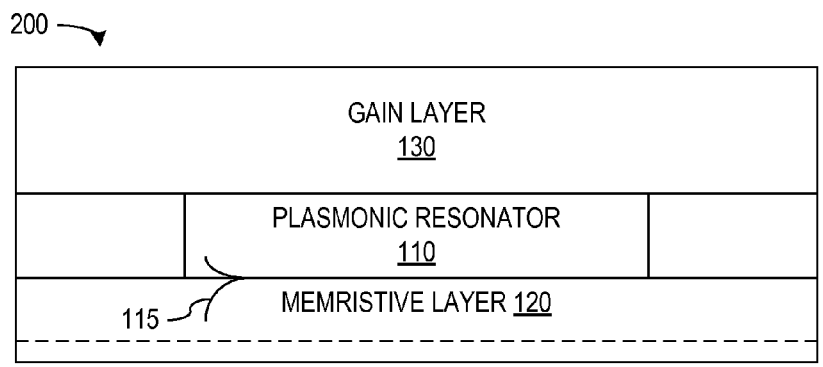
FIG. 2 shows a cross-sectional view of a SPASER in accordance with an embodiment of the invention including the resonator between the memristive layer and the gain layer.

The order of layers in SPASER 100 of FIG. 1 is an example of one configuration of a SPASER having memristive tuning. FIG. 2 shows a SPASER 200 having an alternative configuration in which plasmonic resonator 110 is sandwiched between memristive layer 120 and gain layer 130. This has the advantage of placing gain layer 130 immediately adjacent to plasmonic resonator 110, which may improve the efficiency with which energy is coupled into the desired surface plasmon resonance. SPASER 200 otherwise operates in substantially the same manner as SPASER 100 of FIG. 1. In still other alternative configurations, the position of memristive layer 120 and gain layer 130 may be swapped in the configurations shown in FIG. 1 and FIG. 2. However, some configurations may be less desirable if metal or highly conductive medium absorbs the desired electromagnetic radiation.

Figure 3:
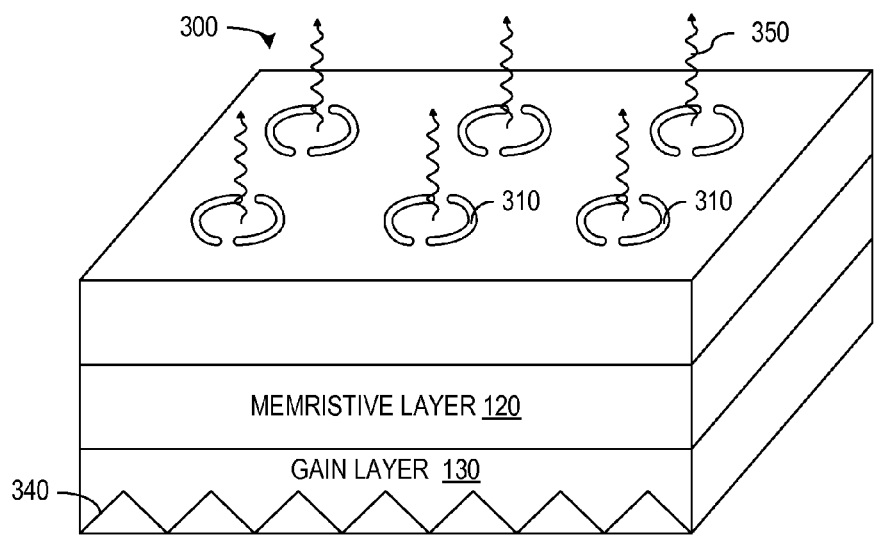
FIG. 3 shows a perspective view of a device in accordance with an embodiment of the invention including multiple SPASERs having resonant plasmon modes that can be separately tuned using an underlying memristive structure.

FIG. 3 shows a perspective view of device 300 including multiple plasmonic resonators 310. In the illustrated embodiment, resonators 310 are split ring resonators but other shapes or designs for resonators 310 could be used. Each resonator 310 corresponds to a SPASER that uses a portion of a memristive layer 120 and a gain layer 130, which may be of the type and structure described above with regard to FIG. 1. Normal device fabrication techniques used to manufacture device 300 will be subjected to variations in the properties of layers 120 and 130 and the exact shape and size of resonators 310. These variations can cause device 300 to differ from other similar devices that are intended to be identical to device 300, so that device 300 may not have exactly the same resonant frequency as devices fabricated to the same design. The manufacturing variations may also cause SPASERs in device 300 to have different resonant frequencies when they were intended to have the same resonant frequency. However, electrical programming of memristive layer 120 can locally change the electrical properties of memristive layer 120 under each resonator 310 so that all resonators 310 have the same resonant frequency and have the resonant frequency that device 310 was intended to have. Tuning resonators to the desired resonant frequency can improve the gain of device 300 since gain layer 130 may be designed to most efficiently couple energy into plasmons having the desired resonant frequency. Of course, resonators 310 are not required to have the same resonant frequencies, so resonators 310 can be intentionally tuned to different resonant frequencies through local control of the electrical properties of memristive layer 120.

In one embodiment of the invention, memristive layer 120 is programmed at the factory to give resonators 310 the desired resonant frequency or frequencies. Device 300 can then be operated without further changes in memristive layer 120. Alternatively, device 300 can provide a user with the capability to apply control signals to memristive layer 120 to change frequency or frequencies of resonators 310 as desired during use of device 300. A user can even use alterations in the properties of memristive layer 120 to effect amplitude or phase modulation of the output from resonators 310. In particular, rapid variations of the electrical permittivity of memristive layer 120 can effectively change or modulate the phase of the plasmon resonance and the emitted electromagnetic radiation. Similarly, variations of the electrical permittivity of memristive layer 120 can effectively change efficiency with which energy from gain layer 130 couples into the plasmon resonance and thereby modulate the amplitude of the emitted electromagnetic radiation. Local control of the electrical properties of memristive layer 120 in device 300 can be achieved, for example, by applying distinct electrical signals to respective resonators 310 when programming memristive layers 120. Alternatively, memristive layer 120 may include a crossbar array such as described by U.S. Pat. App. Pub. No. 2008/0090337 for local control.

FIG. 3 also illustrates an embodiment of the invention where each SPASER emits electromagnetic radiation 350 normal to the plane of resonators 310. In general, plasmon resonances, being oscillations of charges, emit electromagnetic radiation and the frequency of the emitted radiation is the same as the frequency of the plasmon resonance. Thus, programming of the resonant frequencies of resonators 310 controls the frequency of the emitted electromagnetic radiation.

Device 300 further includes a diffractive optical element (DOE) 340 to control the emission of the light. DOE 340 can be used not only to enhance the light output of device 300 but also to control the direction or angle of the emitted light. DOE 340 can either have a fixed pattern formed in device 300 or can be a programmable DOE created using a crossbar memristive array structure such as described above to reconfigure dopants in memristive devices and thereby change the conductivity profile/landscape of DOE 340.

Figure 4:
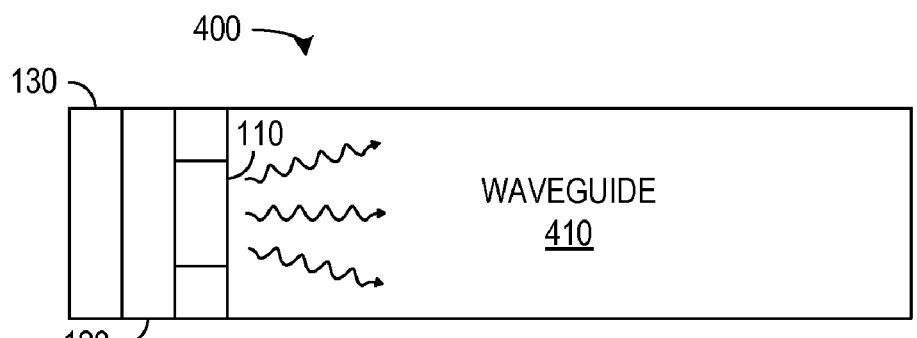
FIG. 4 illustrates an embodiment of a SPASER that emits light into a waveguide.
Figure 5:
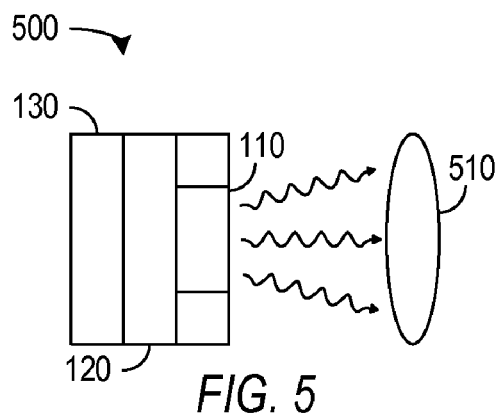
FIG. 5 illustrates an embodiment of a SPASER that emits light into free space.
Figure 6:
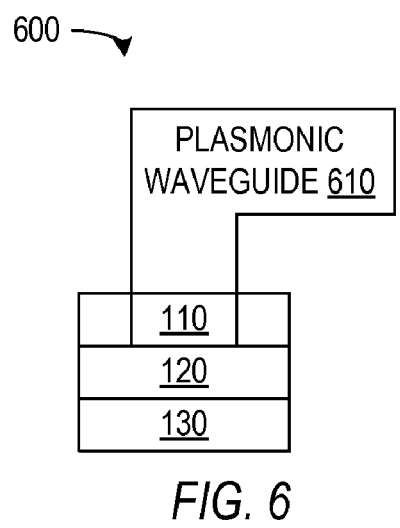
FIG. 6 illustrates of a SPASER that transmits plasmons on a plasmonic waveguide.

The SPASERs described above can be fabricated with small area (e.g., 10 nm to 100 µm in linear dimension) to provide compact sources of light or electric fields. Such devices are useful in a large variety of applications. FIG. 4, for example, illustrates an application in which a SPASER emits light into an optical waveguide 410. Alternatively, FIG. 5 shows an application in which a SPASER 500 emits light into free space via a collimating lens 510. Instead of emitting light, a SPASER 600 can be used as shown in FIG. 6 to produce traveling plasmons for signaling via a plasmonic waveguide 610. Plasmonic waveguides 610 can be metal traces, which can be bent as need for use in nanoscale electronic devices. Tunable spacers have many other potential applications including use as a compact tunable light source for lab-on-a-chip applications.

Figure 7:
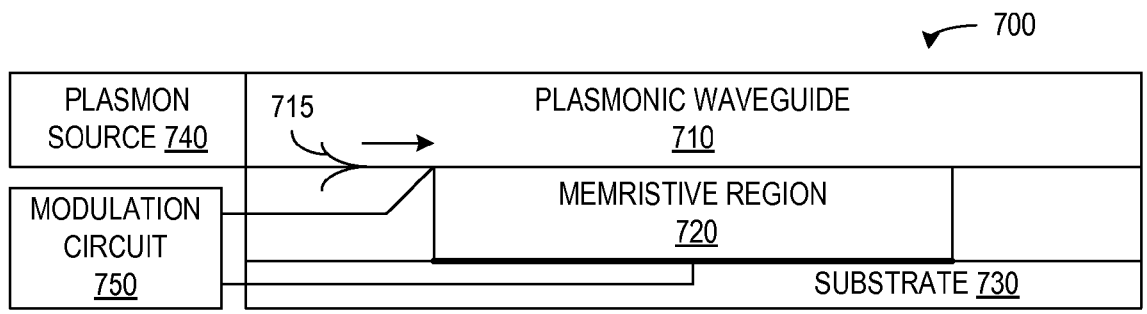
FIG. 7 shows a cross-sectional view of a plasmon phase modulator in accordance with an embodiment of the invention employing a plasmonic wave guide adjacent to a memristive layer.

Aspects of the invention can also be applied for control of plasmon modes that are not confined to a resonator. FIG. 7, for example, shows a cross-sectional view of a plasmon modulator 700 in accordance with an embodiment of the invention. Plasmon modulator 700 includes a plasmonic waveguide 710 and a memristive region 720, which are formed overlying a support substrate 730. Plasmonic waveguide 710 can be a conductive trace made of a metal or other material that is able to support the propagation of a plasmon 715. A typical structure for plasmonic waveguide 710 is a rectangular or planar waveguide having a width between about 10 nm and 10 micron and a thickness between about 10 nm and about 500 nm. However, plasmonic waveguide 710 can alternatively have cross-sections with other shapes such as a V-shape, curved shape, or W-shape. A plasmon source 740 produces plasmon 715, which has a single, fixed frequency, and propagates along plasmonic waveguide 710. Plasmon source 740 may, for example, be a SPASER that is coupled to plasmonic waveguide 710 in the same manner as illustrated in FIG. 6. However, plasmon source 740 may alternatively be any device capable of exciting plasmons 715 that propagate on plasmonic wave guide 710.

Memristive region 720 can have substantially the same structure as memristive layer 120 described above with regard to FIG. 1. However, in modulator 700, memristive region 720 extends along and forms an interface with only part of the length of plasmonic waveguide 710. In general, the length of memristive region 720 may be selected according to the frequency or wavelength of plasmon 715, but in a typical embodiment may be 1 to 10 microns long. In an alternative embodiment, memristive region 720 can extend along the full length of plasmonic waveguide 710, but alterations of electric permeability of memristive region 720 may be limited to a portion of that length.

Surface plasmon 715 propagates along the interface of plasmonic waveguide 710 and underlying material (e.g., an underlying insulator) until plasmon 715 reaches memristive region 720. Plasmon 715 then traverses memristive region 720. The phase of plasmon 715 changes during the traversal of memristive region 720 by a phase delay that depends on the refractive index of the memristive region 720. Accordingly, changing the refractive index of memristive region 720 can alter the relative phase of a plasmon 715 propagating away from memristive region 720. A modulation circuit 750 applies electrical signals to respective electrodes above and below memristive region 720 to move mobile, charged dopants within memristive region 720 and thereby alter the electrical permittivity and refractive index of memristive region 720. Modulator 700 acts as a phase modulator for propagating plasmons and can be used in transmission of information using plasmonic signals. For example, modulation circuit 750 can receive input data and apply signals to switch or vary the electrical permittivity of memristive region 720 as needed to create in plasmon 715 phase variations that represent the input data. The structures, particularly the electrodes and memristive region 720, can be made small to allow modulation frequencies up to a GHz or more. Losses through modulator 700 can be compensated by incorporating a gain layer (not shown) similar to gain layer 130 described above.

Figure 8:
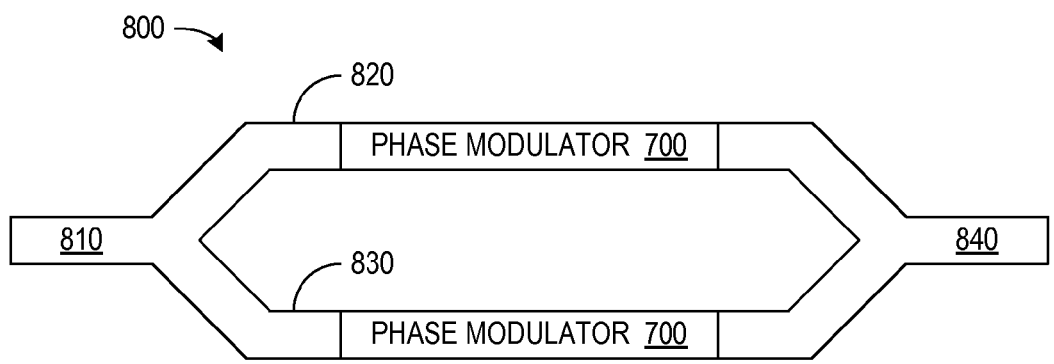
FIG. 8 shows a plan view of a plasmon amplitude modulator in accordance with an embodiment of the invention using one or more plasmon phase modulators.

Plasmon phase modulators of the type illustrated in FIG. 7 can be used to produce an amplitude modulator using a Mach-Zehnder configuration. FIG. 8, for example illustrates a plasmon amplitude modulator 800. Amplitude modulator 800 includes an input plasmonic waveguide 810 that splits into two separate paths 820 and 830 that later recombine into an output plasmonic waveguide 840. A plasmon source (not shown) can excite a plasmon that propagates in plasmon waveguide 810, and the energy in the plasmon splits (preferably in equal parts) into plasmon oscillations propagating on waveguide paths 812 and 814. Plasmon phase modulators 700 can be placed in one or both paths 812 and 814 and operate as described above to change the relative phases of the plasmon oscillations in paths 820 and 830. When the plasmons from paths 820 and 830 combine in output plasmonic waveguide 840, any relative phase difference will cause destructive interference that reduces the amplitude of the plasmons propagating from output plasmonic waveguide 840. Accordingly, modulator 800 can perform amplitude modulation on a plasmon signal.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A device comprising:
    a resonator capable of supporting a plasmon mode;
    a gain structure arranged to couple energy from the gain structure into the plasmon mode in the resonator; and
    a memristive layer arranged to provide an interaction with the plasmon mode, wherein an electrical signal applied to the memristive layer changes the interaction and tunes a resonant frequency of the plasmon mode.

2. The device of claim 1, wherein the device is a SPASER that emits electromagnetic radiation having a frequency that depends on the resonant frequency of the plasmon mode.

3. The device of claim 1, wherein the resonator comprises a region of metal.

4. The device of claim 1, further comprising a plurality of resonators, each of which supports a plasmon mode, wherein the memristive layer provides an interaction with the plasmon modes of the resonators, and electrical signals applied to the memristive layer change the interactions and tune resonant frequencies of the plasmon modes.

5. The device of claim 1, wherein the gain structure comprises a layer of active material that when driven by a current, undergoes transitions that provide an electromagnetic coupling to the plasmon mode.

6. The device of claim 1, wherein the memristive layer has an interface with the resonator, and the plasmon mode is a resonant mode of surface plasmons at the interface.

7. The device of claim 1, wherein the memristive layer comprises:
    a layer of source material containing dopants; and
    a layer of primary material in which the dopants have sufficient mobility to move in response to the electrical signal.

8. The device of claim 6, wherein the dopants are oxygen vacancies.

9. A method comprising:
    fabricating a device that includes:
        a resonator capable of supporting a plasmon mode;
        a gain structure arranged to couple energy from the gain structure into the plasmon mode in the resonator; and
        a memristive layer arranged to provide an interaction with the plasmon mode; and
    applying an electrical signal to the memristive layer to change the interaction and thereby change a resonant frequency of the plasmon mode.

10. The method of claim 9, wherein applying the electric signal is performed at a factory to set the resonant frequency a desired frequency.

11. The method of claim 9, wherein the applying the electric signal is performed by a user of the device to change the resonant frequency during operation of the device.

12. The method of claim 11, wherein applying the electrical signal to the memristive layer causes phase modulation of electromagnetic radiation emitted by the device.

13. The method of claim 11, wherein applying the electrical signal to the memristive layer causes amplitude modulation of electromagnetic radiation emitted by the device.

14. The method of claim 9, further comprising modulating energy coupled into the gain structure to thereby cause amplitude modulation of electromagnetic radiation emitted by the device.

15. The method of claim 9, wherein the device comprises a SPASER.

* * * * *